United States Patent [19]

Koopman et al.

[11] 4,332,343
[45] Jun. 1, 1982

[54] PROCESS FOR IN-SITU MODIFICATION OF SOLDER COMOPSITION

[75] Inventors: Nicholas G. Koopman, Hopewell Junction; Vincent C. Marcotte, La Grangeville; Stephen Teed, Wappingers Falls, all of N.Y.

[73] Assignee: International Business Machines Corporation, Armonk, N.Y.

[21] Appl. No.: 139,076

[22] Filed: Apr. 10, 1980

Related U.S. Application Data

[63] Continuation of Ser. No. 944,224, Sep. 20, 1978, abandoned.

[51] Int. Cl.$^3$ .................. B23K 1/00; B23K 35/26; B23K 35/362
[52] U.S. Cl. .................. 228/231; 228/180 A; 228/223; 148/23; 148/24; 420/563; 420/570
[58] Field of Search .................. 228/180 A, 223, 231; 148/25, 24, 23; 75/166 C, 166 D

[56] References Cited

U.S. PATENT DOCUMENTS

| | | | |
|---|---|---|---|
| 1,782,316 | 11/1930 | Rosinoff et al. | 228/223 |
| 2,161,556 | 6/1939 | Carroll et al. | 228/223 |
| 2,671,264 | 3/1954 | Pessel | 228/259 |
| 2,842,841 | 7/1958 | Schnable et al. | 228/223 |
| 2,947,079 | 8/1960 | Schnable | 228/223 |
| 3,380,821 | 4/1968 | Harvey | 75/166 D |
| 3,478,414 | 11/1969 | Potter et al. | 148/23 |

OTHER PUBLICATIONS

Manko, Howard H., *Solders and Soldering*, McGraw-Hill, Inc., New York, N.Y., 1964, pp. 11, 12, 20, 21, 113, 114 and 179.

*Primary Examiner*—Daniel C. Crane
*Attorney, Agent, or Firm*—Henry Powers

[57] ABSTRACT

Extraction of non-lead components (e.g. tin, indium, etc.) from solder joints with monocarboxylic acids of alkylated hydrophenanthrene nuclei to increase the lead content of the solder joints.

6 Claims, 6 Drawing Figures

EFFECT OF TIME AT TEMPERATURE ON In LEACHING BY α−102 FLUX

EQUILIBRIUM Pb-In BINARY PHASE DIAGRAM

42% In Pb
AS EVAPORATED

8% In Pb
AFTER 280°C 1/2 HR.

TIME DEPENDENCE OF LEACHING OF In FROM 50 InPb C4 SOLDER PADS AT 280°C

EFFECT OF TIME AT TEMPERATURE ON In LEACHING BY α-102 FLUX

THERMAL PROFILES – FURNACE SET TO 280°C

PROCESS FOR IN-SITU MODIFICATION OF SOLDER COMOPSITION

This is a continuation, of application Ser. No. 944,224 filed Sept. 20, 1978, now abandoned.

DESCRIPTION

TECHNICAL FIELD

This invention relates to soldering techniques and, more particularly, to a method for maximizing the lead content of solder joints, inclusive of the type employed in semiconductor fabrication.

One object of the present invention is to provide a novel method for obtaining improved solder joints.

Another object of the present invention is to provide a novel method for increasing the fatigue life of lead based solder joints, by modifying the solder composition, after joining, to a more fatigue resistant alloy.

A further object of this invention is to provide a novel method for increasing the creep resistance of lead based solder joints, by modifying the composition, after joining, to a more creep resistant alloy.

A still further object of this invention is to provide a novel method for maximizing the lead content of lead based solder joints.

Another object of this invention is to provide means for altering the composition of molten solder joints to isothermally shift the melting point of the solder into the solidus portion of its phase diagram.

Another object of the present invention is to provide improved solder interconnections between a semi-conductor device and an underlying conductive pattern of a supporting carrier.

BACKGROUND ART

It is known that pure lead (Pb) is not employed for solder connections since it does not provide the wettability required for good solder joints such as can be obtained with lead alloys such as 95/5-PbSn and 95/5-PbIn solders.

However, pure lead or lead with very high lead content solder joints would provide fatigue lives of better than 2X to 3X, as compared to conventional lead alloy solders. Also, substantially pure lead solder joints would provide increased creep resistance under sustained loads, as compared to 50/50 PbIn solder. See for example, U.S. Pat. No. 3,380,821 and the R. Herdzik et al. article "Dummy Pads for Increased Creep Resistance", p. 1394 of the IBM Technical Disclosure Bulletin (e.g. IBM-TDB), Vol. 20, No. 4, September 1977. To date, no satisfactory way has been known to obtain lead solder joints without inclusion of substantial amounts of wetting agents such as tin or indium.

DISCLOSURE OF THE INVENTION

Figure 1:
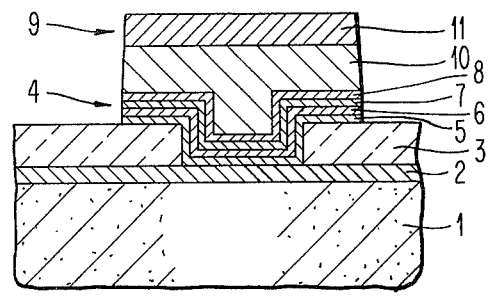
FIG. 1 is an exaggerated cross-section of a structure obtained in the formation of a solder pad.

It has been found that lead content in lead alloy solder joints can be maximized, particularly in flip-chip bonding (see above referred to IBM-TDB) of semiconductor devices to substrates by compositional modification of conventional lead alloy solder joints, after formation. Formation of such solder joints would include the initial use of conventional solders, such as 95/5 PbSn (lead tin) and 95/5 PbIn or 50/50 PbIn (lead indium) solders, and leaching excess tin or indium, from the resulting joints, with a flux comprised of at least one resin acid selected from monocarboxylic acids of an alkylated hydrophenanthrene nuclei having the empirical formula $C_{19}H_{20}COOH$. In this manner, the flux, at elevated temperatures will lower the tin content of a 95/5 PbSn solder joint to less than 1 wt%. Indium reacts even faster and can be leached out of a PbIn solder joint much easier.

Best Modes for Carrying Out The Invention

The majority of the experiments described herein employed integrated circuit chips 1, hereinafter referred to as device chip (FIG. 1) inclusive of a first level aluminum metallization 2, a silicon oxide ($SiO_2$) layer 3, and a contact pad 4 comprised of a 2000 Å chrome (Cr) layer 5, a 10,000 Å layer 6 of copper (Cu) initially phased with Cr (e.g. a 800 Å layer 7) and 1400 Å gold (Au) layer 8. See as an example FIG. 1 of the C. Johnson et al. article "Removal Technique", pp. 2209–10 of the IBM-TDB, Vol. 20, No. 6, November 1977. Each integrated circuit chip contained 121 of such contact pads 4.

Wafers containing such device chips will hereinafter be referred to as device wafers, each containing several hundred device chips. The solder pad 9 was evaporated on the contact pads 4 through a mask to a height of 4.5 mils. Because of the higher vapor pressure of Pb, it was deposited first in a layer 10 followed by deposition of indium (In) in a layer 11. The shape of the evaporated solder pads was that of a truncated cone. The term "wetback" as is used herein denotes a reflow operation for modification of the solder pads, as for example to coalesce the two layer solder pad 4 so as to amalgamate the wetting agent, indium or tin layer 11 into the lead as a solder alloy.

Compositions of solder alloys, including all solder pads, were determined by measuring their melting points using a Perkin-Elmer DSC-II unit (e.g. by Differential Scanning Calorimetry). Because of experimental ease, the cooling traces were used in the measurements. Standards of known compositions were also prepared and run under the same conditions as the solder alloys and the solder pads, including the same amount of material.

The majority of the experiments were conducted in a tube furnace with a nitrogen atmosphere. The samples were placed in a beaker covered with a leaching flux and placed in the furnace on a glass plate with a thermocouple attached.

The fluxes used were Alpha Metals α-102-1500 (with addition of 20% isopropyl alcohol, e.g. IPA, based on the weight of α-102-1500) and α-100-40. Also used were water white rosin and a water soluble flux TBC comprised of 50 vol% triethanolamine and 50 vol% butyl cellosolve. The α-102-1500 flux will be hereinafter referred to as α-102 with the second numerical portion (e.g. 1500) designating the viscosity of the flux. Similarly, the α-100-40 flux will be designated hereinafter as α-100.

The α-102 flux is supplied as 68% solution of abietic acid in benzyl alcohol, and the α-104 flux as a 40% solution of abietic acid in isoproponal. Water white rosin is a resin acid of a monocarboxylic acid of alkylated nuclei having the empirical formula $C_{19}H_{29}COOH$.

Figure 1A:
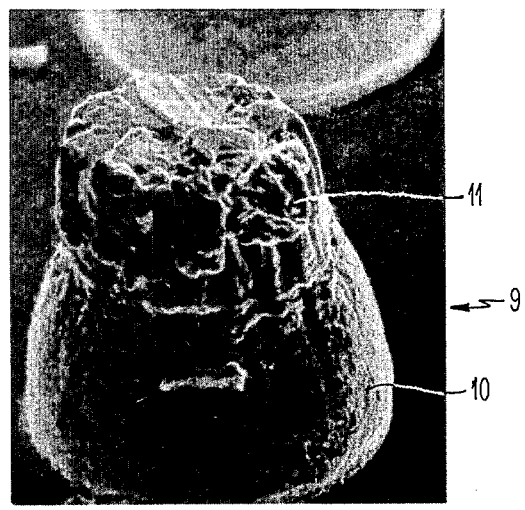
FIGS. 1A and 1B are scanning electron microscope photos at 700X at a 60° angle of, respectively, the structure of FIG. 1 and a solder pad subjected to leaching of wetting agents in accordance with this invention.

The first experiments employed two device wafers (containing 200 device chips) which had complete processing through sequential deposition of 50/50 InPb solder mounds 9, e.g. Pb layer 10 and indium layer 11 (see FIGS. 1 and 1A). To half of one wafer, the α-102 was applied about the solder mounds which were reflowed at 275° C. for two minutes, called herein "leach reflow". After the leach reflow, part of this wafer half was subjected to a second "reflow fix" treatment in a nitrogen ($N_2$) ambient at 275° C. for two minutes. The remaining portion of the half wafer was subjected to both reflow treatments in the reverse order, e.g. first a reflow fix at 275° C. for two minutes in a nitrogen atmosphere, followed by a leach reflow with α-102 at 275° C. for two minutes.

The results are shown in Table 1 below which show that the reflow fix in $N_2$ has no effect on the indium concentration whereas the indium concentration was reduced by the leach reflow with α-102.

| PROCESSING | In CONCENTRATION* |
|---|---|
| Sample 1 | |
| As evaporated | 46% |
| Flux Reflow | 39% |
| Flux + $N_2$ Reflow | 40% |
| Sample 2 | |
| As evaporated | 46% |
| $N_2$ Reflow | 44% |
| $N_2$ + Flux Reflow | 40% |

*Determined from melting points by DSC.

The next experiment employed individual segments of the wafer containing three device chips each (subdivided from the device wafer) placed in a beaker and covered with various fluxes for set times and temperature. In addition, a control sample was employed in which the solder mound was only reflow fixed in nitrogen. In each case, the samples had a contact pad 4. Also employed were samples in which a solder mound 9 was evaporated directly on blank silicon substrates. Table 2 below shows the effect of leaching indium by different fluxes at 280° C. for one-half hour.

Figure 2:
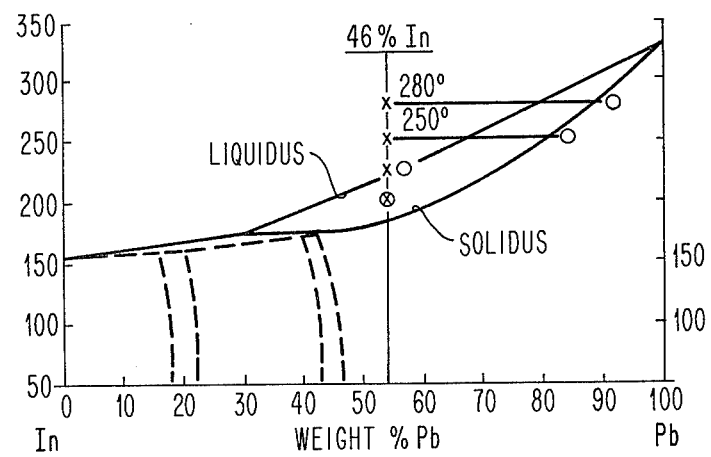
FIG. 2 is an equilibrium Pb-In binary phase diagram.

This invention also enables the rework or replacement of one or more chips of a plurality there bonded to a carrier (e.g. a multi-level ceramic substrate) by, for example, a high melting point solder such as a 85% Pb/15% In solder (see FIG. 2). In such application, due to minuteness of the solder joints, a chip may be mechanically torn or separated from the carrier, followed by positioning a new chip at the stripped site, with chip provided with low melting point solder, e.g. 55% Pb/45% In, and heating the unit to a temperature (e.g. 250° C., see FIG. 2) above the melting point of 55Pb/45In solder but below the melting point of the 85% Pb/15% In, while fluxing, in accordance with the foregoing, to isothermally alter the composition of the 55Pb/45In to 85Pb/15In, which conversely places the solder in solidus portion of the phase diagram. In this manner, chips can be replaced from a multi-chip array without need to melt the solder joints of the remaining chips.

TABLE 2

Effect of Leaching of In from 50/50 InPb Solder by Different Flux - 280° C. ½ hour

| | With Contact Pad | | | Without Contact Pad |
|---|---|---|---|---|
| | Weight | In Content | | Solder Pads Directly |
| | Loss[1] | Weight | | on Silicon in Content |
| | mg | Loss | By DSC | by DSC |
| α-102 | 1.6 | 8% | 8% | 12%* |
| TBC | 0.5 | 38% | 38% | 40% |
| α-100-40 | 1.3 | 19% | 10% | |
| α-102 | 1.6 | 8% | 8% | |
| Abietic Acid | 1.5 | 12% | 6%* | |
| Control | 0 | 46% | 46% | 49% |
| Unreflowed | | | 46% | 48% |

*In Detected in Flux by Emission Spectroscopy
[1]Weight Chip Before Loss not Chip After As seen in Table 2, the control sample did not change with heating and was the same composition as a non-heat treated the same. All the rosin based fluxes (e.g. α-102, α-104 and abietic acid) induced a large reduction in the indium content. The water soluble TBC induced only a slight decrease in the indium content of the solder mounds. Chips without contact pads had a higher indium content reflecting the lack of influence of the copper and gold metallurgy. The indium content as determined by weight loss showed slight variability, which is attributed to poor cleaning of the samples after leach reflow.

Figure 1B:
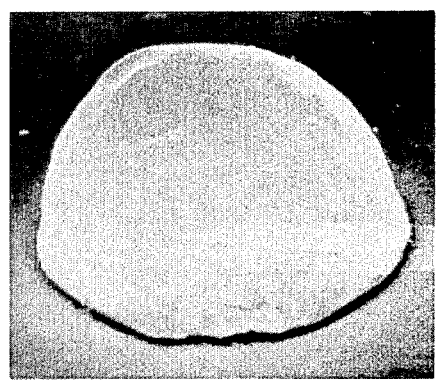

In FIGS. 1A and 1B are shown SEM (scanning electron microscope) micrographs of two solder pads; one as evaporated and the other after a half hour leach reflow at 280° C. in α-102 flux. The indium cap 11 can be seen on the as-evaporated solder pad, as well as the change in volume of the solder pad due to heating in the flux which reflects the loss of indium from the solder pad.

The temperature dependence of the leaching of indium from 50/50 InPb solder mounds is shown in Table 3 below.

TABLE 3

Effect of Temperature on Leaching of In from 50/50 InPb Solder Mounds. α-102-1500 + 20% IPA (isopropyl alcohol) Flux for ½ hour at Temperature.

| | Weight Loss | In Content | |
|---|---|---|---|
| Temp °C. | mg | Weight Loss | DSC |
| 280° C. | 1.6 | 8% | 8% |
| 250° C. | 1.1 | 25% | 15% |
| 225° C. | 0.24 | 42% | 42% |
| 200° C. | 0.1 | 45% | 45% |

In Table 3, all chips were held for a half hour at the indicated temperatures. The same results are plotted on a Pb-In phase diagram in FIG. 2, which shows graphically the reduction of indium at 280° C. and 250° C.

The time dependence of α-102 and TBC reactions were determined at 280° C. on 50/50 InPb solder mounds. The α-102 flux was reacted at 280° C. with the chip samples as-evaporated and after a prior reflow fix treatment, no difference was noted between the two as shown in Table 4 below.

TABLE 4

Effect of Time at 280° C. on Leaching of In From 50/50 InPb Solder Pads.

| | % In Remaining in Pads (by DSC) | | |
|---|---|---|---|
| Time in Furnace | TBC As-Evap | α-102-1500 + 20% IPA With Prior | |
| | | As-Evap | N₂ Reflow Set |
| 0 Min. | 46 | 46 | 46 |
| 5 Min. | 46 | 44 | 44 |
| 10 Min. | 45 | 27 | 29 |
| 15 Min. | 43 | 15 | 15 |
| 30 Min. | 38 | 8 | 8 | at 350° C. 5 Min. α-102 7% In Remaining

Figure 3:
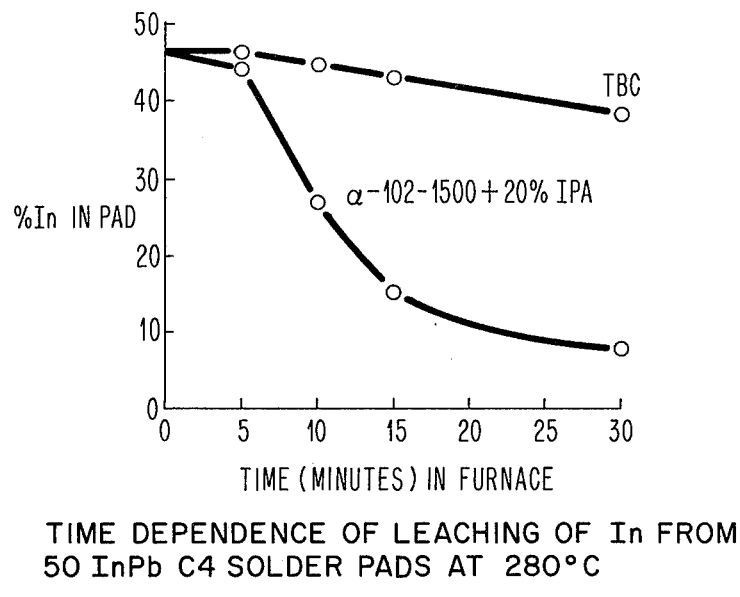
FIG. 3 is a time dependence curve for the leaching of indium from a 50/50 InPb solder pad.

A plot of the time dependence of the α-102 and TBC fluxes is shown in FIG. 3. There is an "incubation time" for the α-102 flux, then a very rapid leaching action with the rate slowing down as the indium concentration decreases. The TBC flux had a constant rate of decrease.

Figure 4:
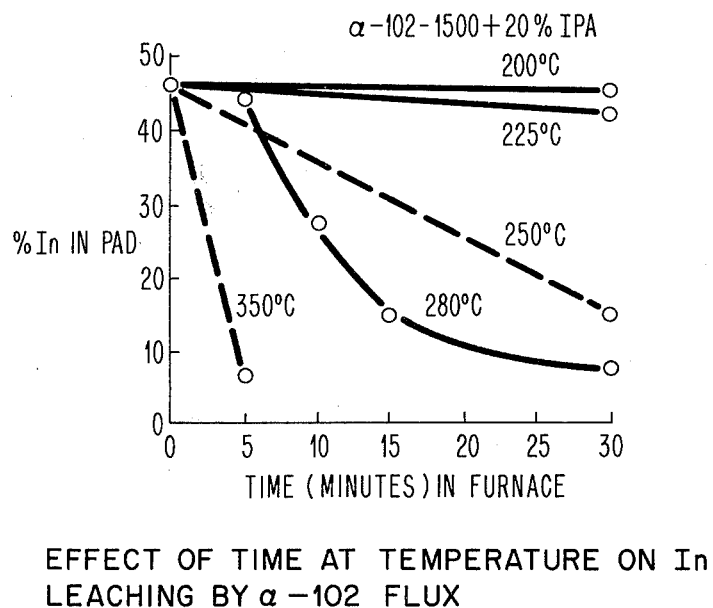
FIG. 4 is a graph showing the effect of time at temperature on indium leaching from a 50/50 InPb solder pad.

In FIG. 4 is shown the time dependence of the α-102 flux at different temperatures, with the 250° C. curve probably having the same shape as the 280° C. curve, if additional points were established. It may be noted that after 5 minutes at 350° C., the indium content is essentially the same as that after a half hour at 280° C.

Figure 5:
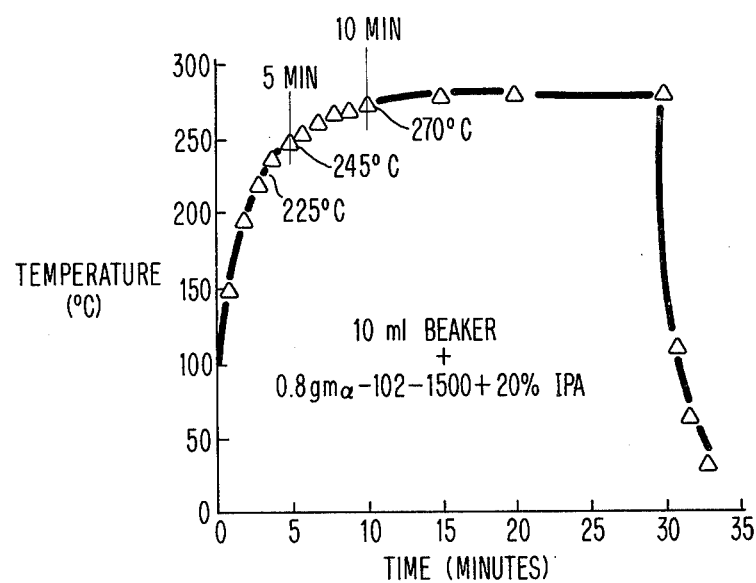
FIG. 5 is a thermal profile of a furnace set to 280° C.

The time in all of the foregoing experiments was the total time in the furnace. In FIG. 5 is shown the furnace thermal profile set to 280° C., which was obtained by placing the thermocouple in a beaker of flux and monitoring the temperature with the beaker placed in the furnace. All conditions were similar to the experimental conditions. After five minutes, the temperature is only 245° C., which appears to explain the "incubation time" indicated in FIGS. 3 and 4.

A check on the approximate solubility of indium in abietic acid was done by holding 500 mg slugs of pure indium in known weights of abietic acid. The results of 200° C. and 280° C. are given in Table 5 below.

TABLE 5

Solubility* of Pure In in Abietic Acid After Leaching (By Weight Loss)

| | Solubility |
|---|---|
| 200° C. 44 Hr. | 5.1–6.8% In |
| 280° C. 19 Hr. | 6–10% In |

*Not necessarily Equilibrium
Indium and Abietic Acid Analyzed by DSC and DTA (differential thermal analysis) Results Inconclusive.

For this Table, the weight loss of the indium was determined and solubilities calculated. Two solubility values are given based on initial and final weight of the rosin, since there is loss of abietic acid on heating. The difference in solubility between 200° C. and 280° C. is not great enough to explain the results of the leaching experiments given in Table 3 and shown in FIG. 2.

Since the solubility of indium in rosin is in the order of 10% at 280° C., the reduction of rosin in the flux would reduce the amount of indium removed. The effects of the variation in weight ratio of rosin to 50/50 InPb was studied at 280° C. (actual temperature of sample was 285° C.). Two ratios of rosin to 50/50 InPb were used 1:1 and 5:1. A 200 mg piece of 50/50 InPb was placed in a beaker with the required weight of rosin. The results are shown in Table 6.

TABLE 6

Indium Dissolution-Bulk Studies As Function of Rosin: Alloy 50 InPb Ratio

| | 285° C. | | | | |
|---|---|---|---|---|---|
| | 1:1 | | 5:1 | | 200:1* |
| Ratio | % In Left | | % In Left | | % In Left |
| Time | Weight Loss | DSC | Weight Loss | DSC | DSC |
| ½ Hr. | — | — | — | — | 8% |
| 1 Hr. | 47 | 47 | 42 | 42 | — |
| 4 Hrs. | 49 | 47 | 29 | 34 | — |
| 12 Hrs. | — | — | 27 | 26 | — |
| 15 Hrs. | 45 | 46 | — | — | — |

*From Results on Chip Pads

As would be expected, the more rosin the greater the reduction of indium in the alloy. For comparison, the results on chip solder mounds are shown utilizing contact pads. The nominal ratio of rosin to 50/50 InPb was 200:1 which may have varied by ±25%. With the greater sink of rosin present with the chips, a much greater depletion of indium occurred in a much shorter time.

Another way to present these results is to look at the concentration of indium in the rosin. These results are shown in Table 7.

TABLE 7

Indium Dissolution-Bulk Studies As Function of Rosin: 50 InPb Ratio, Indium Concentration in Rosin (By Weight Loss)

| | 285° C. | | |
|---|---|---|---|
| | 1:1 | 5:1 | |
| | % Indium | % Indium | 200:1* |
| Ratio | in Rosin | in Rosin | % Indium |
| Time | Final | Final | in Rosin |
| ½ Hr. | | | 0.2 |
| 1 Hr. | 7.3 | 3.4 | |
| 4 Hrs. | 4.0 | 7.2 | |
| 12 Hrs. | | 7.8 | |
| 15 Hrs. | 13.2 | | |

*From Results on Chip Pads

The results are given as compositions using final weights of rosin. The rosin was most likely saturated with indium or nearly so after 15 hours for the 1:1 weight ratio. For the 5:1 ratio after 12 hours, the rosin was not saturated and for the chips very little indium was in solution, although nearly all the indium was removed from the solder pads. This clearly shows that the greater the weight ratio of rosin to 50/50 InPb alloy the greater the dissolution, which should be expected.

A chip with 5/95 SnPb was held at 350° C. for a half hour and the Sn content was reduced from 5% to ¾% Sn with α-102 flux. The results given in Table 8 along with atomic absorption (AA) show results for shorter heat-treatment times.

TABLE 8

Sn Dissolution by α-102-1500 at 350° C. for 2 minutes Multiple Wetback Excess Flux

| | Sn Content | |
|---|---|---|
| Sample | DSC | AA* |
| Control — Cleaned | 4.6% | 7.1% |
| 1 Wetback + flux | 3.1% | 5.2% |
| 2 Wetback + new flux | 2.3% | 2.7% |

*Results questionable since technique is not sensitive to tin.

Although there is a discrepancy in the higher Sn content alloys, it is demonstrated that Sn is also leached from SnPb solders by rosin base fluxes. Chips with nominal 5/95 SnPb were sent through three reflow cycles using α-102-1500+20% IPA with new flux each time. The composition changed from 4.5% Sn to 3.5% Sn as measured by DSC.

Figure 6A:
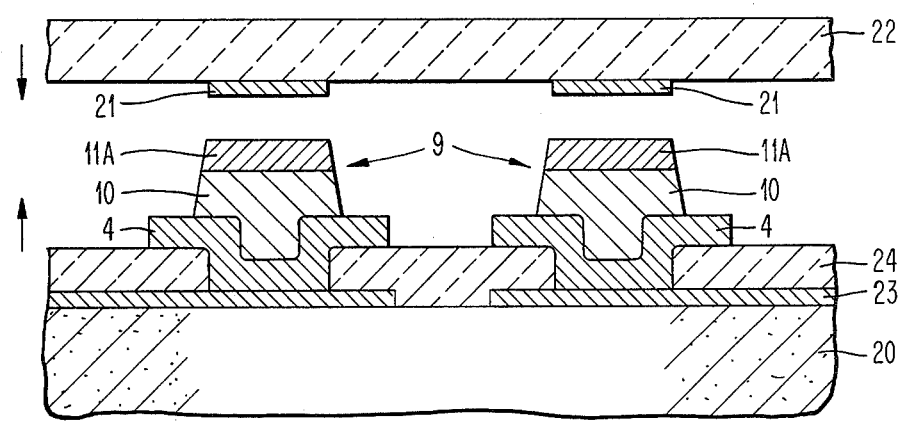
FIGS. 6A and 6B illustrate stages in the maximization of lead in solder joints as applied to semiconductor fabrication.
Figure 6B:
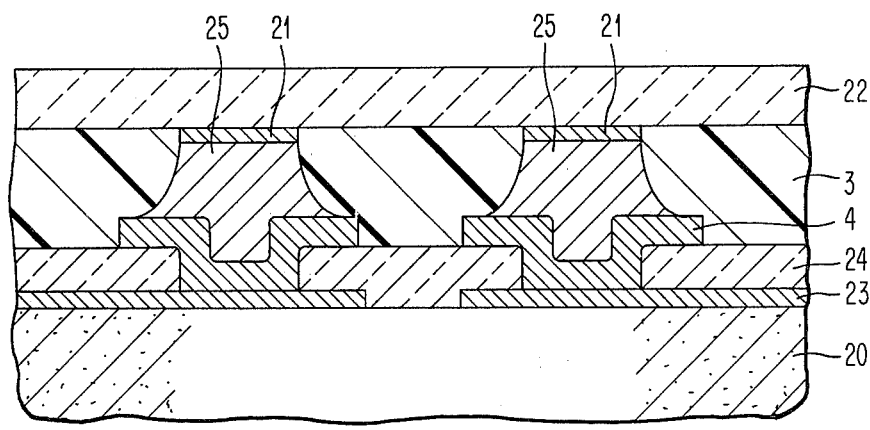

FIGS. 6A and 6B illustrate stages in the fabrication of modified chip solder joining of a chip 20 to a conductor pattern 21 of a ceramic carrier 22. Although not shown, the device chip 20 incorporates an integrated circuit provided with a first level aluminum conductor pattern 23, portions of which are exposed by contact opening in a passivating layer 24 such as silicon dioxide. Contact pads 4 (e.g. such as in FIG. 1) are formed about each opening in contact with the lower aluminum metallization 23. Sequentially deposited on each contact pad is the lead layer 10 and the tin layer 11A as a bilayered solder mound 9. This bilayered solder mound 9 can be reflowed to amalgamate the tin layer 11A into the lead layer 10 to form a 5/95 SnPb alloy solder mound 25. The chip 20 is then superimposed on the ceramic substrate 22 with alloy solder mounds 25 in register with required metallization 21 of the ceramic substrate 22, and the units joined by conventional solder reflow operation. The voids between the joined chip 20 and substrate 22 are filled with α-102 flux fill 30 and the assembly reflow leached at for ½ hour at 350° C. The tin content of the alloy solder mounds 25 was reduced to about 0.4% tin.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

Having thus described our invention, what we claim as new, and desire to secure by Letters Patent is:

1. A method for in-situ altering the composition of solder alloys containing wetting agents selected from the group of tin and indium comprising fluxing a said solder alloy in its molten form for sufficient time with at least one acid selected from the monocarboxylic acids of alkylated hydrophenanthrene nuclei having the empirical formula $C_{19}H_{29}COOH$, to remove said wetting agents from said molten solder and to materially reduce to less than 90% of the original content of said wetting agents in said molten solder.

2. A method of claim 1 wherein said acids are in the form of water white rosin.

3. A method for in-situ altering the composition of solder alloys containing wetting agents selected from the group of tin and indium comprising:
    applying said solder alloys between solderable parts, to be joined together, at a temperature above the melting point of said solder alloy, and
    fluxing said solder alloy in molten form for a time sufficient to remove said wetting agents therefrom and to materially reduce to less than 90% of the original content of said wetting agents in said molten solder.

4. The method of claim 3 wherein said solder is fluxed for a time at said temperature to remove sufficient amount of said wetting agents to shift the composition of said molten solder at said temperature to a point on the solidus curve of the phase diagram of said solder alloy.

5. The method of claims 1, 2, 3 or 4 wherein solder alloys join a semiconductor device to a supporting dielectric substrate wherein the circuit configuration of said device is electrically interconnected to a circuit pattern of said substrate.

6. A method for in-situ altering the composition of solder alloys containing wetting agents comprising:
    applying said solder alloy between solderable parts, to be joined together, at a temperature above the melting point of said solder alloy, and
    fluxing said solder alloy in molten form for a time sufficient to remove said wetting agents therefrom and to materially reduce to less than 90% of the original content of said wetting agents in said molten solder.

* * * * *

UNITED STATES PATENT AND TRADEMARK OFFICE
CERTIFICATE OF CORRECTION

PATENT NO. : 4,332,343

DATED : June 1, 1982

INVENTOR(S) : N. G. Koopman, V. C. Marcotte and S. Teed

It is certified that error appears in the above—identified patent and that said Letters Patent is hereby corrected as shown below:

Column 3, line 15    after "ated" and before "nuclei" insert --hydrophenone--

Signed and Sealed this

Third Day of May 1983

[SEAL]

Attest:

Attesting Officer

GERALD J. MOSSINGHOFF

Commissioner of Patents and Trademarks